United States Patent
Zenzai (10) Patent No.: US 11,581,137 B2
(45) Date of Patent: Feb. 14, 2023

(54) MULTILAYER CERAMIC ELECTRONIC COMPONENT AND ELECTRICALLY CONDUCTIVE PASTE FOR RESIN ELECTRODE

(71) Applicant: Murata Manufacturing Co., Ltd., Nagaokakyo (JP)

(72) Inventor: Kota Zenzai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 287 days.

(21) Appl. No.: 16/897,323

(22) Filed: Jun. 10, 2020

(65) Prior Publication Data

US 2021/0050152 A1 Feb. 18, 2021

(30) Foreign Application Priority Data

Aug. 13, 2019 (JP) .............................. JP2019-148287

(51) Int. Cl.
*B22F 1/00* (2022.01)
*C08L 63/00* (2006.01)
(Continued)

(52) U.S. Cl.
CPC ........... *H01G 4/008* (2013.01); *B22F 1/0007* (2013.01); *B22F 1/16* (2022.01); *C08L 63/00* (2013.01); *H01B 1/22* (2013.01); *H01G 4/12* (2013.01); *H01G 4/224* (2013.01); *H01G 4/2325* (2013.01); *H01G 4/30* (2013.01); *H05K 1/092* (2013.01)

(58) Field of Classification Search
CPC .......... B22F 1/0007; B22F 1/107; B22F 1/16; B22F 1/17; B22F 7/002; B22F 1/00; C08L 63/00; C22C 1/0425; C22C 1/0466; H01B 1/22; H01G 4/008; H01G 4/12; H01G 4/224; H01G 4/232; H01G 4/2325; H01G 4/30; H05K 1/092; H05K 1/09
USPC ................. 361/305, 301.4, 500; 174/260
See application file for complete search history.

(56) References Cited

U.S. PATENT DOCUMENTS

| | | | |
|---|---|---|---|
| 2003/0016486 A1* | 1/2003 | Takahara ................. | H01G 4/12 361/321.2 |
| 2016/0027583 A1* | 1/2016 | Ahn .......................... | H01G 4/12 361/301.4 |
| 2017/0032896 A1* | 2/2017 | Otani ....................... | H01G 4/30 |

FOREIGN PATENT DOCUMENTS

| | | | | |
|---|---|---|---|---|
| CN | 102653638 A | * | 9/2012 | ............... B05D 1/18 |
| CN | 102653638 B | * | 11/2015 | ............... B05D 1/18 |
| JP | 2016-106356 A | | 6/2016 | |

OTHER PUBLICATIONS

Adhesion Promoters-Silane Coupling Agents_Peter Pope_pp. 503-517_Jul. 2011.*
Wettability Determines Adhesion_Lauren_pp. 1-7_Jul. 2019.*

* cited by examiner

*Primary Examiner* — Timothy J Thompson
*Assistant Examiner* — Guillermo J Egoavil
(74) *Attorney, Agent, or Firm* — Keating & Bennett, LLP (57) ABSTRACT

A multilayer ceramic capacitor includes a ceramic base body including ceramic layers and internal electrode layers, which are stacked on each other, and a pair of external electrodes provided on the end surfaces of the ceramic base body and electrically connected to the internal electrode layers. Each of the external electrodes includes an underlying electrode layer and a resin external electrode layer stacked on the underlying electrode layer. The resin external electrode layer includes a thermosetting resin, a metal powder, and an alkyl-based silane coupling agent.

8 Claims, 5 Drawing Sheets

(51) Int. Cl.
*H01B 1/22* (2006.01)
*H01G 4/008* (2006.01)
*H01G 4/12* (2006.01)
*H01G 4/224* (2006.01)
*H01G 4/232* (2006.01)
*H01G 4/30* (2006.01)
*H05K 1/09* (2006.01)
*B22F 1/16* (2022.01)

PRESENT INVENTION

FIG. 5B

COMPARATIVE EXAMPLE

MULTILAYER CERAMIC ELECTRONIC COMPONENT AND ELECTRICALLY CONDUCTIVE PASTE FOR RESIN ELECTRODE

CROSS REFERENCE TO RELATED APPLICATIONS

This application claims the benefit of priority to Japanese Patent Application No. 2019-148287 filed on Aug. 13, 2019. The entire contents of this application are hereby incorporated herein by reference.

BACKGROUND OF THE INVENTION

1. Field of the Invention

The present invention relates to a multilayer ceramic electronic component, for example, a multilayer ceramic capacitor, and to an electrically conductive paste for a resin electrode.

2. Description of the Related Art

Typically, when stress concentrates on an end portion of an external electrode of multilayer ceramic electronic components, the ceramic main body may crack. To address such a problem, a structure in which electrically conductive resin electrode layers are stacked on the underlying Cu electrode layer in the external electrode has been proposed.

Japanese Unexamined Patent Application Publication No. 2016-106356 discloses a technique of an electrically conductive resin paste that can be heat-treated at low temperatures such as 200° C. or lower and that can be used to obtain an electrically conductive film having a sufficiently low electrical resistivity. More specifically, Japanese Unexamined Patent Application Publication No. 2016-106356 discloses an example in which Ag powder is surface-treated with a fatty acid, such as stearic acid.

Typically, regarding an external electrode having a structure including such an electrically conductive resin electrode layer, when the electrically conductive resin electrode layer has high porosity, relaxation properties of the resin decrease, and the ceramic base body cracks.

It has been found that when stearic acid, for example, is used for an electrically conductive resin paste for forming an electrically conductive resin electrode layer, as in the related art, the porosity of the electrically conductive resin electrode layer increases and the relaxation properties of the resin decrease, and that the ceramic base body is thus likely to crack.

SUMMARY OF THE INVENTION

Preferred embodiments of the present invention provide multilayer ceramic electronic components and electrically conductive pastes resin electrodes. In such multilayer ceramic electronic components, an electrically conductive resin electrode layer has low porosity, and relaxation properties of the resin significantly improve, and the ceramic base body is thus unlikely to crack.

A multilayer ceramic electronic component according to a preferred embodiment of the present invention includes a ceramic base body including a plurality of ceramic layers stacked on each other and a plurality of internal electrode layers stacked on each other, a first main surface and a second main surface that face each other in a stacking direction, a first side surface and a second side surface that face each other in a width direction perpendicular or substantially perpendicular to the stacking direction, and a first end surface and a second end surface that face each other in a length direction perpendicular or substantially perpendicular to the stacking direction and the width direction, and a pair of external electrodes that are electrically connected to the internal electrode layers, each external electrode being provided on one of the first and second end surfaces, the first and second main surfaces, and the first and second side surfaces. Each of the pair of external electrodes includes an underlying electrode layer electrically connected to the internal electrode layers and a resin external electrode layer stacked on the underlying electrode layer. The resin external electrode layer includes an alkyl-based silane coupling agent.

An electrically conductive paste for a resin electrode according to a preferred embodiment of the present invention includes an alkyl-based silane coupling agent.

According to preferred embodiments of the present invention, the dispersibility of the metal powder and the resin in the resin external electrode layer significantly improves and the porosity of the resin external electrode layer decreases, thus providing multilayer ceramic electronic components in each of which the resin has excellent relaxation properties and in which the ceramic base body is unlikely to crack.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

1. Multilayer Ceramic Electronic Component

A multilayer ceramic electronic component according to a preferred embodiment of the present invention will be described. Hereinafter, a multilayer ceramic capacitor will be described as an exemplary multilayer ceramic electronic component. The present preferred embodiment will be described with respect to a typical two-terminal capacitor as an example. The present preferred embodiment is applicable not only to such capacitors but also to, for example, multilayer ceramic inductors, multilayer ceramic thermistors, and multilayer ceramic piezoelectric components.

Figure 1:
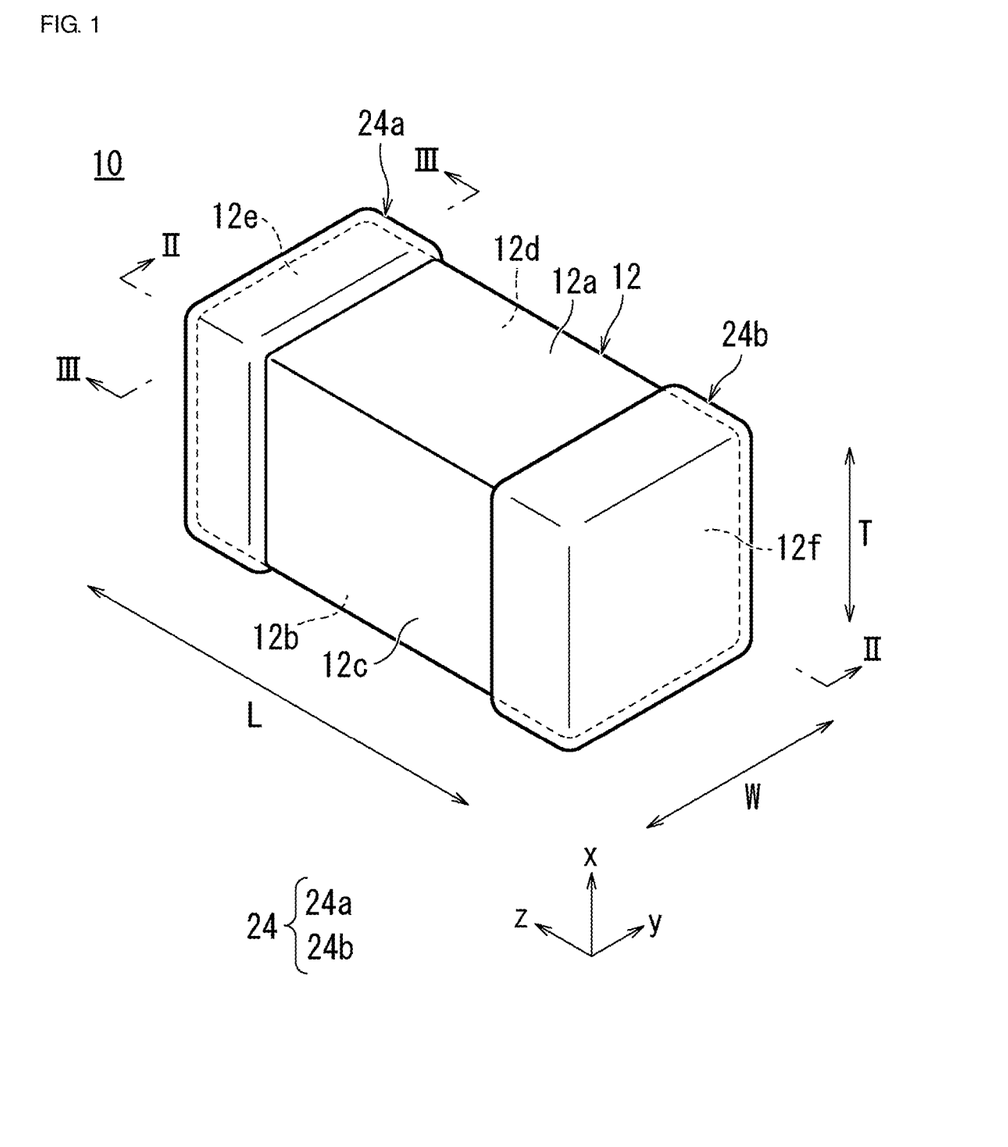
FIG. 1 is an external perspective view of an exemplary multilayer ceramic electronic component according to a preferred embodiment of the present invention.
Figure 2:
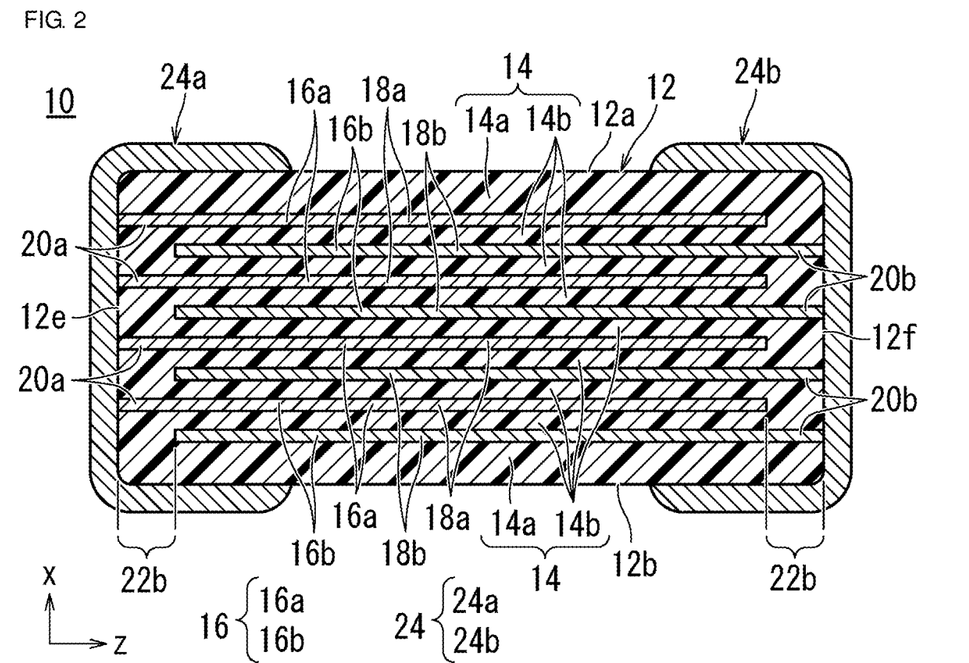
FIG. 2 is a cross-sectional view taken along line II-II of FIG. 1.
Figure 3:
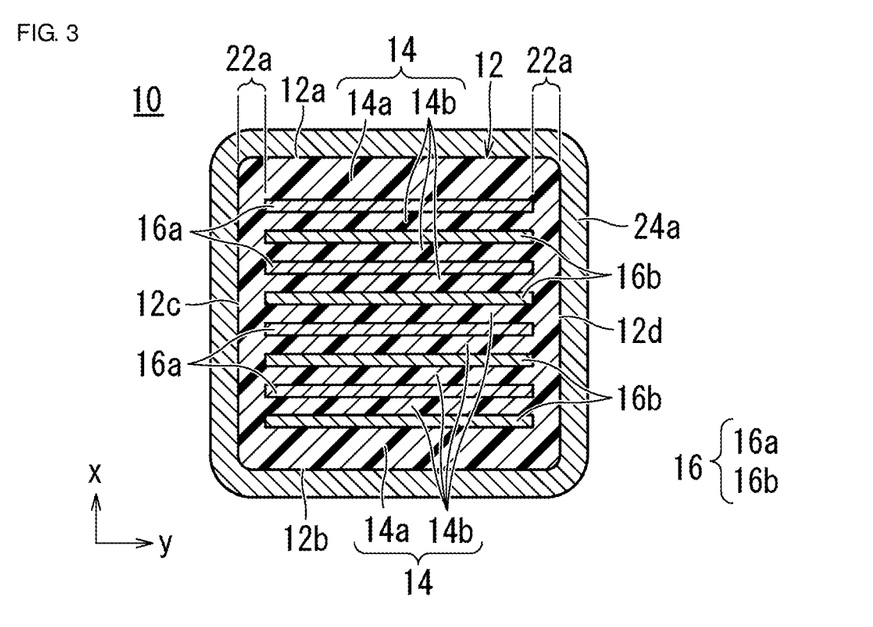
FIG. 3 is a cross-sectional view taken along line III-III of FIG. 1.
Figure 4:
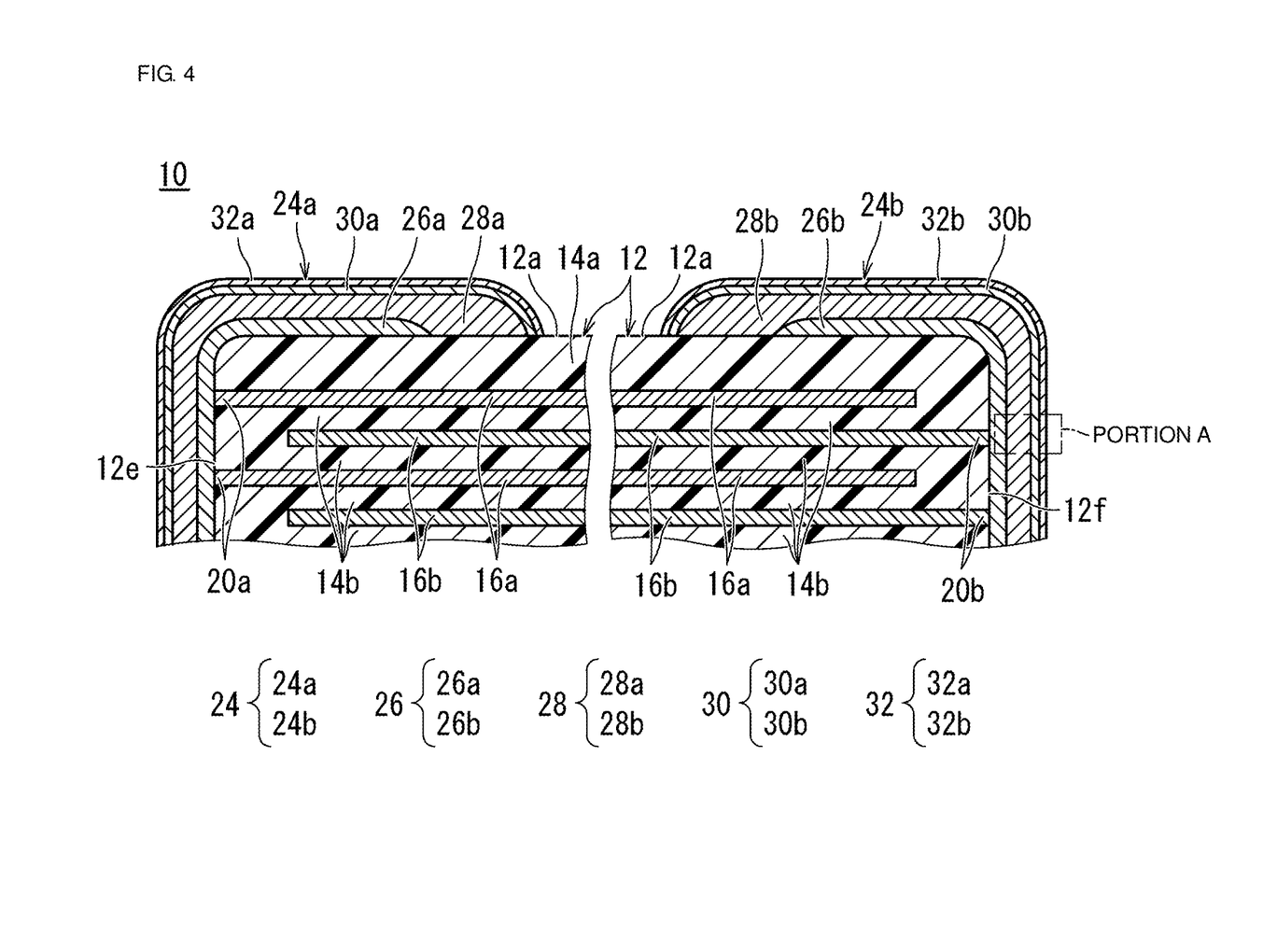
FIG. 4 is an exploded cross-sectional view of the external electrode and a portion adjacent thereto in the cross-sectional view of FIG. 2.
Figure 5A:
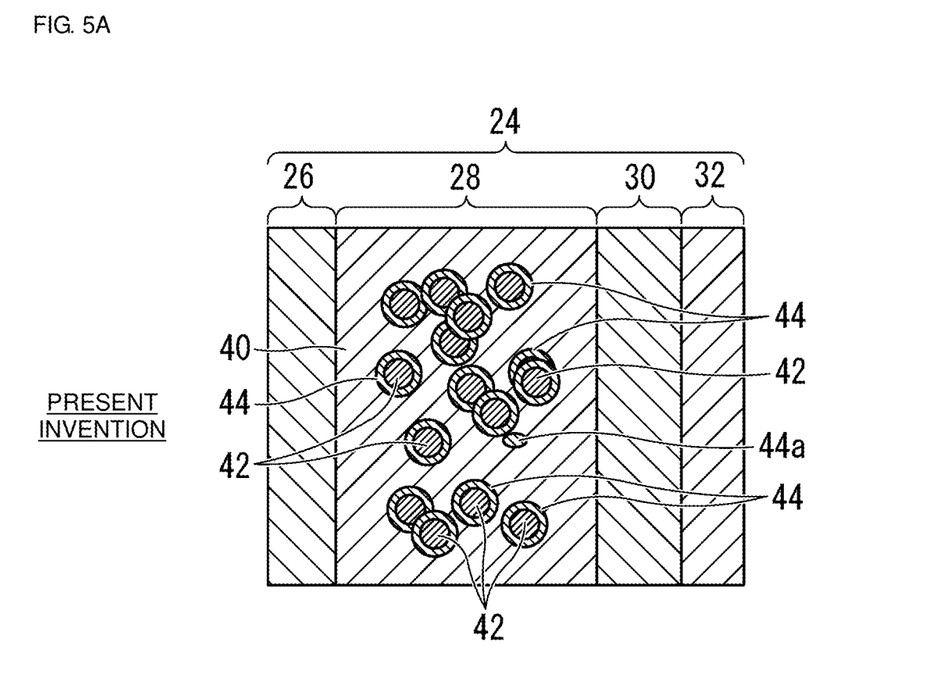
FIGS. 5A and 5B are each an exploded cross-sectional view of portion A in the cross-sectional view of FIG. 4.
Figure 5B:
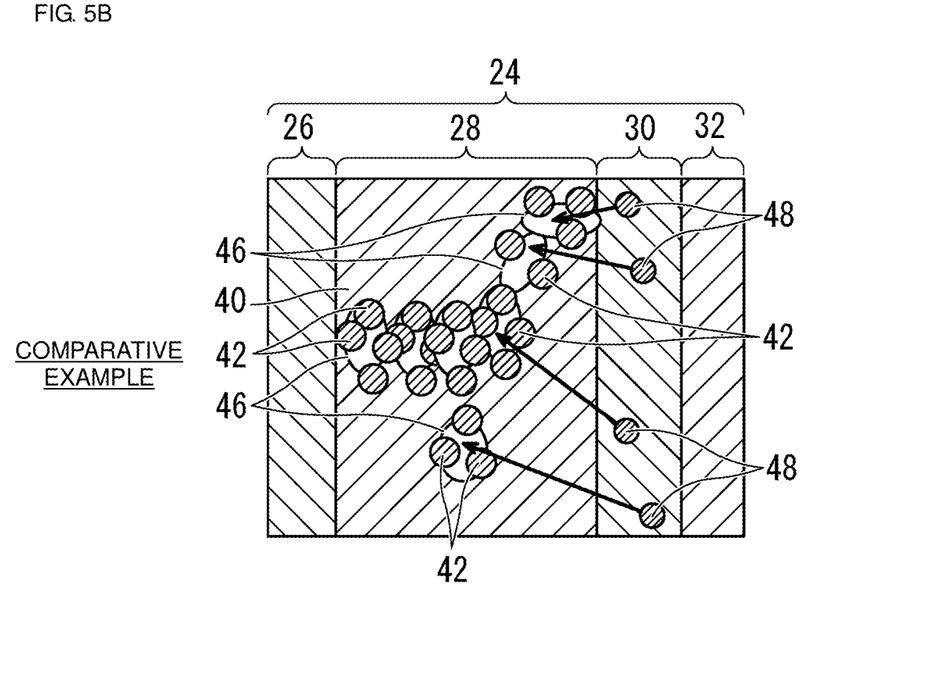

FIG. 1 is an external perspective view of an exemplary multilayer ceramic capacitor 10 according to a preferred embodiment of the present invention. FIG. 2 is a cross-sectional view taken along line II-II of FIG. 1. FIG. 3 is a cross-sectional view taken along line III-III of FIG. 1. FIG. 4 is an exploded cross-sectional view of the external electrode and a portion adjacent thereto in the cross-sectional view of FIG. 2. FIGS. 5A and 5B are each an exploded cross-sectional view of portion A of FIG. 4.

The multilayer ceramic capacitor 10 includes a rectangular parallelepiped or substantially rectangular parallelepiped ceramic base body 12 and two external electrodes 24.

The ceramic base body 12 includes plural ceramic layers 14 stacked on each other and plural internal electrode layers 16 stacked on each other. Furthermore, the ceramic base body 12 includes a first main surface 12a and a second main surface 12b that face each other in a stacking direction x, a first side surface 12c and a second side surface 12d that face each other in a width direction y perpendicular or substantially perpendicular to the stacking direction x, and a first end surface 12e and a second end surface 12f that face each other in a length direction z perpendicular or substantially perpendicular to the stacking direction x and the width direction y. The dimensions of the ceramic base body 12 are not particularly limited. Regarding the ceramic base body 12, the dimension in the length direction z is not necessarily longer than the dimension in the width direction y.

In the ceramic base body 12, the corners and the ridges are preferably rounded, for example. A corner is a portion where three adjacent surfaces of the ceramic base body 12 meet. A ridge is a portion where two adjacent surfaces of the ceramic base body 12 meet. Irregularities may be provided in all or portions of the first main surface 12a and the second main surface 12b, in all or portions of the first side surface 12c and the second side surface 12d, and in all or portions of the first end surface 12e and the second end surface 12f.

The ceramic layers 14 of the ceramic base body 12 include outer layer portions 14a and inner layer portions 14b. The outer layer portion 14a is positioned on each of the first-main-surface-12a side and the second-main-surface-12b side of the ceramic base body 12. The outer layer portions 14a are the ceramic layer 14 positioned between the first main surface 12a and the internal electrode layer 16 closest to the first main surface 12a and the ceramic layer 14 positioned between the second main surface 12b and the internal electrode layer 16 closest to the second main surface 12b. The region sandwiched between both outer layer portions 14a includes the inner layer portions 14b. The outer layer portion 14a preferably has a thickness of about 20 μm or more and about 300 μm or less, for example.

The number of the ceramic layers 14 stacked on each other is not particularly limited and is preferably about 15 or more and about 1,550 or less including the number of the outer layer portions 14a, for example.

The dimensions of the ceramic base body 12 are not particularly limited. Preferably, for example, the dimension in the length direction z is about 0.58 mm or more and about 5.6 mm nor less, the dimension in the width direction y is about 0.28 mm or more and about 4.9 mm or less, and the dimension in the stacking direction x is about 0.28 mm or more and about 2.9 mm or less.

The ceramic layer 14 may be defined by a dielectric material. The dielectric material may be a dielectric ceramic including a main component, for example, $BaTiO_3$, $CaTiO_3$, $SrTiO_3$, or $CaZrO_3$. When the above dielectric material is included as a main component, an accessory component, for example, such Mn compound, a Fe compound, a Cr compound, a Co compound, or a Ni compound, may be added in an amount smaller than that of the main component, in accordance with the predetermined characteristics of the ceramic base body 12.

When a piezoelectric ceramic is included in the ceramic base body 12, the multilayer ceramic electronic component defines and functions as a ceramic piezoelectric element. A specific example of the piezoelectric ceramic material may be a lead zirconate titanate (PZT)-based ceramic material.

When a semiconductor ceramic is included in the ceramic base body 12, the multilayer ceramic electronic component defines and functions as a thermistor element. A specific example of the semiconductor ceramic material may be a spinel-based ceramic material.

When a magnetic ceramic is included in the ceramic base body 12, the multilayer ceramic electronic component defines and functions as an inductor element. When the multilayer ceramic electronic component defines and functions as an inductor element, a coil conductor is included in place of the internal electrode layers 16. A specific example of the magnetic ceramic material may be a ferrite ceramic material.

The ceramic layer 14 preferably, for example, has a thickness of about 0.48 μm or more and about 20 μm or less after being fired.

The ceramic base body 12 includes the internal electrode layers 16, which include first internal electrode layers 16a and second internal electrode layers 16b. The first and second internal electrode layers 16a and 16b may have a rectangular or substantially rectangular shape. The first internal electrode layers 16a and the second internal electrode layers 16b are embedded, and the first internal electrode layers 16a and the second internal electrode layers 16b are alternately provided at regular intervals with the ceramic layers 14 provided therebetween in the stacking direction x of the ceramic base body 12.

The first internal electrode layer 16a includes a first opposing electrode portion 18a, which opposes the second internal electrode layer 16b, and a first extended electrode portion 20a, which is positioned adjacent to or in a vicinity of an end of the first internal electrode layer 16a and extends from the first opposing electrode portion 18a to the first end surface 12e of the ceramic base body 12. An end portion of the first extended electrode portion 20a that is adjacent to or in a vicinity of the first end surface 12e is exposed.

The second internal electrode layer 16b includes a second opposing electrode portion 18b, which opposes the first internal electrode layer 16a, and a second extended electrode portion 20b, which is positioned adjacent to or in a vicinity of an end of the second internal electrode layer 16b and extends from the second opposing electrode portion 18b to the second end surface 12f of the ceramic base body 12. An end portion of the second extended electrode portion 20b that is adjacent to or in a vicinity of the second end surface 12f is exposed.

The ceramic base body 12 includes side portions 22a (hereinafter, referred to as "W gaps"), which are provided between the first side surface 12c and ends of the first opposing electrode portions 18a and the second opposing electrode portions 18b in the width direction y and between the second side surface 12d and the other ends of the first opposing electrode portions 18a and the second opposing electrode portions 18b in the width direction y. Furthermore, the ceramic base body 12 includes end portions 22b (hereinafter, referred to as "L gaps"), which are provided between the second end surface 12f and end portions of the first internal electrode layers 16a that are positioned opposite the first extended electrode portions 20a and between the first end surface 12e and end portions of the second internal electrode layers 16b that are positioned opposite the second extended electrode portions 20b.

The internal electrode layer 16 may include an appropriate electrically conductive material, for example, a metal or an alloy. Examples of the metal include Ni, Cu, Ag, Pd, and Au. Examples of the alloy include alloys including at least one of the above metals, such as Ag—Pd alloy. The internal electrode layer 16 may further include dielectric particles having the same composition or a similar composition as the ceramic included in the ceramic layer 14.

The internal electrode layer 16 preferably, for example, has a thickness of about 0.3 μm or more and about 2.0 μm or less. The number of the internal electrode layers 16 is preferably about 15 or more and about 1,550 or less, for example.

The external electrodes 24 are provided on the first-end-surface-12e side and the second-end-surface-12f side of the ceramic base body 12. The external electrodes 24 include a first external electrode 24a and a second external electrode 24b.

The first external electrode 24a is provided on the first end surface 12e of the ceramic base body 12. The first external electrode 24a extends from the first end surface 12e and partially covers each of the first main surface 12a, the second main surface 12b, the first side surface 12c, and the second side surface 12d. Accordingly, the first external electrode 24a is electrically connected to the first extended electrode portions 20a of the first internal electrode layers 16a.

The second external electrode 24b is provided on the second end surface 12f of the ceramic base body 12. The second external electrode 24b extends from the second end surface 12f and partially cover each of the first main surface 12a, the second main surface 12b, the first side surface 12c, and the second side surface 12d. Accordingly, the second external electrode 24b is electrically connected to the second extended electrode portions 20b of the second internal electrode layers 16b.

In the ceramic base body 12, the first opposing electrode portions 18a of the first internal electrode layers 16a and the second opposing electrode portions 18b of the second internal electrode layers 16b oppose each other with the ceramic layers 14 provided therebetween to generate electrostatic capacitance. Thus, electrostatic capacitance is provided between the first external electrode 24a, to which the first internal electrode layers 16a are electrically connected, and the second external electrode 24b, to which the second internal electrode layers 16b are electrically connected, and capacitor characteristics are provided.

The first external electrode 24a and the second external electrode 24b each include an underlying electrode layer 26 electrically connected to the internal electrode layers 16, a resin external electrode layer 28 stacked on the underlying electrode layer 26, a Ni plating layer 30, and a Sn plating layer 32. The Ni plating layer 30 and the Sn plating layer 32 are sequentially stacked on the resin external electrode layer 28.

The underlying electrode layer 26 includes a first underlying electrode layer 26a and a second underlying electrode layer 26b.

The first underlying electrode layer 26a is provided on the first end surface 12e of the ceramic base body 12. The first underlying electrode layer 26a extends from the first end surface 12e and partially cover each of the first main surface 12a, the second main surface 12b, the first side surface 12c, and the second side surface 12d.

The second underlying electrode layer 26b is provided on the second end surface 12f of the ceramic base body 12. The second underlying electrode layer 26b extends from the second end surface 12f and partially cover each of the first main surface 12a, the second main surface 12b, the first side surface 12c, and the second side surface 12d. The first underlying electrode layer 26a may be provided only on the first end surface 12e of the ceramic base body 12. The second underlying electrode layer 26b may be provided only on the second end surface 12f of the ceramic base body 12.

The underlying electrode layer 26 includes an electrically conductive metal and a glass component, for example. The underlying electrode layer 26 preferably includes at least one metal selected from metals and alloys, for example, Cu, Ni, Ag, Pb, Ag—Pb alloy, and Au. The glass of the underlying electrode layer 26 preferably includes at least one selected from, for example, B, Si, Pd, Ba, Mg, Al, and Li. The underlying electrode layer 26 may include plural layers. The underlying electrode layer is provided by applying an electrically conductive paste including glass and metal to the ceramic base body 12 and baking the paste. The underlying electrode layer 26 may be provided by simultaneously firing the paste, the ceramic layers 14, and the internal electrode layers 16, or by baking the paste after firing the ceramic layers 14 and the internal electrode layers 16. The thickest portion of the underlying electrode layer 26 preferably has a thickness of about 10 μm or more and about 150 μm or less, for example.

Regarding the underlying electrode layer 26, the center region of the portion on the first end surface 12e and the center region of the portion on the second end surface 12f are thicker than the other portions. Accordingly, the contact angle between the solder and the plating of the external electrode 24 is acute when the solder and the plating are connected to each other. Thus, when stress is applied from the solder to the plating during thermal shock cycles, a component of stress that is parallel or substantially parallel to the flat surface of the plating increases, and therefore, an advantageous effect of decreasing the probability of solder cracking is able to be further provided. Regarding the underlying electrode layer 26 in the external electrode 24, the portion on the first main surface 12a, the portion on the second main surface 12b, the portion on the first side surface 12c, and the portion on the second side surface 12d each preferably have a thickness of about 5 μm or more and about 20 μm or less, for example.

The resin external electrode layer 28 includes a first resin external electrode layer 28a and a second resin external electrode layer 28b.

The first resin external electrode layer 28a covers the first underlying electrode layer 26a. Specifically, the first resin external electrode layer 28a preferably, for example, is provided on the surface of a portion of the first underlying electrode layer 26a that is provided on the first end surface 12e, and extends to the surface of portions of the first underlying electrode layer 26a that are provided on the first main surface 12a, the second main surface 12b, the first side surface 12c, and the second side surface 12d. The first resin external electrode layer 28a may be provided only on the surface of a portion of the first underlying electrode layer 26a that is provided on the first end surface 12e. The first resin external electrode layer 28a may cover the surface of a portion of the first underlying electrode layer 26a that is provided on the first end surface 12e and to partially cover the surface of portions of the first underlying electrode layer 26a that are provided on the first main surface 12a, the second main surface 12b, the first side surface 12c, and the second side surface 12d.

Similarly, the second resin external electrode layer 28b covers the second underlying electrode layer 26b. Specifically, that the second resin external electrode layer 28b is preferably, for example, provided on the surface of a portion of the second underlying electrode layer 26b that is provided on the second end surface 12f, and extends to the surface of portions of the second underlying electrode layer 26b that are provided on the first main surface 12a, the second main surface 12b, the first side surface 12c, and the second side surface 12d. The second resin external electrode layer 28b may be provided only on the surface of a portion of the second underlying electrode layer 26b that is provided on the second end surface 12f. The second resin external electrode layer 28b may cover the surface of a portion of the second underlying electrode layer 26b that is provided on the second end surface 12f and to partially cover the surface of portions of the second underlying electrode layer 26b that are provided on the first main surface 12a, the second main surface 12b, the first side surface 12c, and the second side surface 12d.

The resin external electrode layer 28 preferably has a thickness of, for example, about 10 µm or more and about 200 µm or less.

As shown in FIG. 5A, the resin external electrode layer includes an alkyl-based silane coupling agent 44, a thermosetting resin 40, and metal powder particles (electrically conductive filler particles) 42. The alkyl-based silane coupling agent 44 covers the surface of the metal powder particles 42. A portion 44a of the alkyl-based silane coupling agent 44, which covers the surface of the metal powder particle 42, may be separated from the surface of the metal powder particle 42 and be included in the thermosetting resin 40. In the resin external electrode layer 28, the amount of carbon of the alkyl-based silane coupling agent 44 relative to the amount of the metal powder particles 42 is preferably about 0.02 wt % or more and about 0.40 wt % or less, for example.

As shown in FIG. 5A, when the alkyl-based silane coupling agent 44 is added, the wettability between the thermosetting resin 40 and the metal powder particles 42 is good, and the thermosetting resin 40 is uniformly provided. Thus, the thermosetting resin 40 forms small aggregates, in other words, dispersibility significantly improves. Furthermore, the porosity of the resin external electrode layer 28 decreases, thus providing the multilayer ceramic capacitor 10, which includes a resin having excellent relaxation properties and in which the ceramic base body 12 is unlikely to crack. In addition, the equivalent series resistance (ESR) is able to be decreased.

For a comparison, the resin external electrode layer 28 not including the alkyl-based silane coupling agent 44 is shown in FIG. 5B. As shown in FIG. 5B, when the alkyl-based silane coupling agent 44 is not added, the wettability between the thermosetting resin 40 and the metal powder particles 42 is poor, and the thermosetting resin 40 is not uniformly provided. Thus, the thermosetting resin 40 forms large aggregates, in other words, dispersibility is poor. Furthermore, the porosity of the resin external electrode layer 28 increases, and ingress of Ni particles 48 in the Ni plating layer 30 into pores 46 is likely to occur. Then, the resin external electrode layer 28 is likely to crack. When the pores 46 are present at the interface between the ceramic base body 12 and the resin external electrode layer 28, the ceramic base body 12 is likely to crack. As the number of the pores 46 in the resin external electrode layer 28 increases, the cure shrinkage of the thermosetting resin 40 decreases and the equivalent series resistance (ESR) increases.

The alkyl-based silane coupling agent 44 does not necessarily cover the entire or substantially the entire surface of the metal powder particles 42 and may at least partially cover the surface. In addition, all of the metal powder particles 42 are not necessarily covered with the alkyl-based silane coupling agent 44. Some of the metal powder particles 42 may not be covered with the alkyl-based silane coupling agent 44.

Examples of the alkyl-based silane coupling agent include methyltrimethoxysilane, dimethyldimethoxysilane, phenyltrimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, octyltriethoxysilane, 1,6-bis(trimethoxysilyl)hexane, and trifluoropropyltrimethoxysilane.

In Table 1 shown later, data of a case in which an epoxy-based silane coupling agent is applied as a surface treatment agent for the metal powder is not shown. From an experiment, it has been found that when an epoxy-based silane coupling agent is applied, dispersibility is worse, the porosity is larger, and the vulnerability to deflection is higher than when an alkyl-based silane coupling agent is applied.

The resin external electrode layer 28 includes a thermosetting resin and is thus more flexible than the plating layer and the underlying electrode layer 26. Therefore, if a physical impact force or an impact force due to thermal cycles is applied to the multilayer ceramic capacitor 10, the resin external electrode layer 28 defines and functions as a buffer layer to significantly reduce or prevent cracking of the multilayer ceramic capacitor 10.

Specific examples of the thermosetting resin included in the resin external electrode layer 28 include various known thermosetting resins, such as epoxy resins, phenol resins, urethane resin, silicone resins, and polyimide resins. Among such resins, an epoxy resin having excellent heat resistance, moisture resistance, and adhesion is one of the more preferable resins. The resin external electrode layer 28 preferably includes a curing agent in addition to a thermosetting resin, for example. When an epoxy resin is included as the base resin, examples of the curing agent include various known compounds, such as phenol-based, amine-based, acid anhydride-based, and imidazole-based compounds.

Ag powder, Cu powder, or powder of an alloy of the above metals may preferably be included in the metal powder included in the resin external electrode layer 28. Metal particles having the surface coated with Ag may be included. When metal particles having the surface coated with Ag are included, the metal particles preferably include Cu or Ni, for example. Cu that has been subjected to oxidation-prevention treatment may be included. Metal particles coated with Ag maintain the above Ag characteristics while including cheaper metal particles as the base material. The metal powder included in the resin external electrode layer 28 preferably includes at least one of Ag powder, Cu powder, and Ag-coated powder, for example.

The metal powder is preferably included in the resin external electrode layer 28 in an amount of about 35 vol % or more and about 75 vol % or less relative to the total volume of the resin external electrode, for example. The shape of the metal powder (electrically conductive filler) is not particularly limited. The metal powder may be a spherical metal powder or a flat metal powder. A spherical metal powder and a flat metal powder are preferably included in mixture, for example.

Accordingly, the percentage by weight of spherical metal powder relative to the metal powder (sphere percentage) is preferably about 70% or more and about 90% or less, for example. As the amount of spherical metal powder increases, ease of releasing air increases, and thus, the porosity of the resin external electrode layer 28 decreases. However, the electrically conductive paste for a resin external electrode is likely to separate due to thermal cure shrinkage during the production of the multilayer ceramic capacitor 10. Thus, mixing a flat metal powder at a predetermined ratio leads to a decrease in the ease of separation due to thermal cure shrinkage. If the mixing ratio of a flat metal powder is too high, gaps between the powder particles become larger, and thus it is difficult to remove an organic solvent included in the electrically conductive paste for a resin external electrode. The sphere percentage is calculated from the following formula: sphere percentage={(weight of spherical metal powder)/(weight of spherical metal powder+weight of flat metal powder)}×100.

The average particle size of the metal powder may preferably be, for example, about 0.3 µm or more and about 10.0 µm or less, and is not particularly limited.

The main function of the metal powder included in the resin external electrode layer 28 is to provide electrically conductivity for the resin external electrode layer 28. Specifically, the direct contact of the metal powder particles/tunnel effect provides a current path in the resin external electrode layer 28. Preferably, for example, the resin external electrode layer 28 covers the underlying electrode layer and the edge of the resin external electrode layer 28 is preferably about 10 µm or more and about 800 µm or less, for example, away from the edge of the underlying electrode layer 26. Accordingly, the resin external electrode layer 28 is able to have a sufficiently large area to decrease stress applied during thermal shock cycles, and the solder cracking mitigation effect is provided.

The Ni plating layer 30 includes a first Ni plating layer 30a and a second Ni plating layer 30b.

The first Ni plating layer 30a covers the first resin external electrode layer 28a. Specifically, the first Ni plating layer 30a is preferably, for example, provided on the surface of a portion of the first resin external electrode layer 28a that is provided above the first end surface 12e, and extends to the surface of portions of the first resin external electrode layer 28a that are provided on and above the first main surface 12a, the second main surface 12b, the first side surface 12c, and the second side surface 12d.

Similarly, the second Ni plating layer 30b covers the second resin external electrode layer 28b. Specifically, the second Ni plating layer 30b is preferably, for example, provided on the surface of a portion of the second resin external electrode layer 28b that is provided above the second end surface 12f, and extends to the surface of portions of the second resin external electrode layer 28b that are provided on and above the first main surface 12a, the second main surface 12b, the first side surface 12c, and the second side surface 12d.

The Sn plating layer 32 includes a first Sn plating layer 32a and a second Sn plating layer 32b.

The first Sn plating layer 32a covers the first Ni plating layer 30a. Specifically, the first Sn plating layer 32a is preferably, for example, provided on the surface of a portion of the first Ni plating layer 30a that is provided above the first end surface 12e, and extends to the surface of portions of the first Ni plating layer 30a that are provided above the first main surface 12a, the second main surface 12b, the first side surface 12c, and the second side surface 12d.

Similarly, the second Sn plating layer 32b covers the second Ni plating layer 30b. Specifically, the second Sn plating layer 32b is preferably, for example, provided on the surface of a portion of the second Ni plating layer 30b that is provided above the second end surface 12f, and extends to the surface of portions of the second Ni plating layer 30b that are provided above the first main surface 12a, the second main surface 12b, the first side surface 12c, and the second side surface 12d.

The Ni plating layer 30 covers the surface of the resin external electrode layer 28 and the underlying electrode layer 26. Thus, when the multilayer ceramic capacitor 10 is mounted, erosion of the underlying electrode layer 26 and the resin external electrode layer 28 by a solder used to mount the multilayer ceramic capacitor 10 is able to be significantly reduced or prevented. The Sn plating layer 32 provided on the surface of the Ni plating layer 30 significantly improves the wettability of a solder used to mount the multilayer ceramic capacitor 10, and thus, mounting of the multilayer ceramic capacitor 10 is able to be readily performed.

Each plating layer may have any thickness and preferably has a thickness of about 1 µm or more and about 15 µm or less, for example.

The dimension in the length direction z of the multilayer ceramic capacitor 10 including the ceramic base body 12, the first external electrode 24a, and the second external electrode 24b is denoted by dimension L. The dimension in the stacking direction x of the multilayer ceramic capacitor 10 including the ceramic base body 12, the first external electrode 24a, and the second external electrode 24b is denoted by dimension T. The dimension in the width direction y of the multilayer ceramic capacitor 10 including the ceramic base body 12, the first external electrode 24a, and the second external electrode 24b is denoted by dimension W.

Regarding the dimensions of the multilayer ceramic capacitor 10, dimension L in the length direction z is preferably about 0.6 mm or more and about 5.7 mm or less, for example, dimension W in the width direction y is preferably about 0.3 mm or more and about 5.0 mm or less, for example, and dimension T in the stacking direction x is preferably about 0.3 mm or more and about 3.0 mm or less, for example.

2. METHOD FOR PRODUCING MULTILAYER CERAMIC ELECTRONIC COMPONENT

Next, a preferred embodiment of the method for producing a multilayer ceramic electronic component having the above features will be described with reference to the multilayer ceramic capacitor 10 shown in FIG. 1.

First, ceramic green sheets that form the ceramic layers 14, an electrically conductive paste for an internal electrode that forms the internal electrode layers 16, and an electrically conductive paste for an external electrode that forms the underlying electrode layer 26 of the external electrode 24 are prepared. The ceramic green sheets, the electrically conductive paste for an internal electrode, and the electrically conductive paste for an external electrode include an organic binder and an organic solvent. The organic binder may be a known organic binder, and the organic solvent may be a known organic solvent.

A predetermined pattern is printed by applying the electrically conductive paste for an internal electrode to form an internal electrode pattern on the ceramic green sheet. Printing with the electrically conductive paste for an internal electrode may be performed by a known method, for example, screen printing or gravure printing.

Next, a predetermined number of outer-layer ceramic green sheets on which the internal electrode pattern is not formed are stacked on each other. On such a stack, ceramic green sheets on which the internal electrode pattern is formed are sequentially stacked. Then, on such a stack, a predetermined number of outer-layer ceramic green sheets are stacked to produce a mother multilayer body. The mother multilayer body may optionally be pressure-bonded in the stacking direction x by, for example, isostatic pressing.

Thereafter, a raw multilayer chip having a predetermined shape is cut out from the mother multilayer body. While cutting is performed, the corners and the ridges of such a raw multilayer chip may be rounded by, for example, barrel finishing. Subsequently, the raw multilayer chip, which has been cut out, is fired to produce the ceramic base body 12. The firing temperature of the raw multilayer chip depends on the ceramic material or the material of the electrically conductive paste for an internal electrode and is preferably about 900° C. or higher and about 1300° C. or lower, for example.

Next, the first external electrode 24a and the second external electrode 24b are respectively provided on the first end surface 12e and the second end surface 12f of the ceramic base body 12. In other words, first, a paste for an underlying electrode layer is applied to the first end surface 12e and the second end surface 12f of the ceramic base body 12, which has been fired, and is baked to form the first underlying electrode layer 26a of the first external electrode 24a and the second underlying electrode layer 26b of the second external electrode 24b. The baking temperature is preferably about 700° C. or higher and about 900° C. or lower, for example.

Subsequently, the resin external electrode layer 28 is formed. An electrically conductive paste for a resin external electrode including an alkyl-based silane coupling agent, a metal powder, and a thermosetting resin is applied to cover the first underlying electrode layer 26a, so that the first resin external electrode layer 28a is formed. Similarly, the electrically conductive paste for a resin external electrode, which includes an alkyl-based silane coupling agent, a metal powder, and a thermosetting resin, is applied to cover the second underlying electrode layer 26b, so that the second resin external electrode layer 28b is formed.

In the electrically conductive paste for a resin external electrode, the amount of carbon of the alkyl-based silane coupling agent relative to the amount of the metal powder is preferably about 0.02 wt % or more and about 0.40 wt % or less, for example, when measured by a carbon content analysis method using a C/S measuring apparatus.

The resin external electrode layer 28 is formed by heat-treating the electrically conductive paste for a resin external electrode at about 80° C. or higher and about 280° C. or lower, for example, to heat-cure the thermosetting resin. The electrically conductive paste for a resin external electrode is preferably heat-treated at about 180° C. or higher and about 230° C. or lower, for example.

Next, the Ni plating layer 30 is formed. The first Ni plating layer 30a covers the first resin external electrode layer 28a. Similarly, the second Ni plating layer 30b covers the second resin external electrode layer 28b.

Subsequently, the Sn plating layer 32 is formed. The first Sn plating layer 32a covers the first Ni plating layer 30a. Similarly, the second Sn plating layer 32b covers the second Ni plating layer 30b.

Accordingly, the multilayer ceramic capacitor 10 is produced.

3. EXAMPLES

The multilayer ceramic capacitor samples in which the metal powders had been subjected to different surface treatments were produced. Measurement of the surface free energy of the surface treatment agents, measurement of the porosity of the resin external electrode layers, and the deflection test and ESR measurement of the multilayer ceramic capacitors were performed.

In Comparative Example 1, a multilayer ceramic capacitor in which the surface of the metal powder was not covered with a surface treatment agent was produced. In Comparative Example 2, a multilayer ceramic capacitor in which the surface of the metal powder was covered with a stearic acid agent defining and functioning as the surface treatment agent was produced. In Comparative Example 3, a multilayer ceramic capacitor in which the surface of the metal powder was covered with a stearylamine (long-chain amine) agent defining and functioning as the surface treatment agent was produced. In Comparative Example 4, a multilayer ceramic capacitor in which the surface of the metal powder was covered with a surface treatment agent including a stearic acid agent and a stearylamine agent was produced. In Example 1, a multilayer ceramic capacitor in which the surface of the metal powder was covered with an alkyl-based silane coupling agent defining and functioning as the surface treatment agent was produced.

Specifications of the multilayer ceramic capacitor are as follows.

Size L×W×T (designed value): about 3.2 mm×about 2.5 mm×about 2.5 mm

Ceramic material: $BaTiO_3$

Electrostatic capacity: about 10 μF

Rated voltage: 25 V

Internal electrode: Ni

Structure of external electrode underlying electrode layer material of underlying electrode layer: electrically conductive metal (Cu)

thickness of underlying electrode layer (the thickest portion in the center portion on the end surface): about 65 μm resin external electrode layer metal powder (electrically conductive filler): Ag-coated Cu thermosetting resin: epoxy-based resin surface treatment agent for metal powder: see treatment agent in Table 1 thickness of resin external electrode layer (the thickest portion in the center portion on the end surface): about 90 μm Ni plating layer: about 5.0 μm in thickness Sn plating layer: about 5.0 μm in thickness (1) Method for Measuring Surface Free Energy The surface free energy of the Ag-coated Cu, which had been treated with the above surface treatment agent, was measured by the known Kitazaki-Hata method.

(2) Method for Measuring Porosity of Resin External Electrode Layer

The multilayer ceramic capacitor was processed with a focused ion beam (FIB) apparatus to provide a cross section of the multilayer ceramic capacitor. The cross section was observed by SEM in the backscattered electron mode. From the SEM image, the percentage of the total area of pores per certain area of the resin external electrode layer was calculated. In calculation, a white portion in the image was regarded as a pore. From the image analysis, the total area of pores was calculated.

(3) Method of Deflection Test

A multilayer ceramic capacitor sample was mounted on a JIS substrate (glass-epoxy substrate) with about 1.6 mm of thickness by a solder. The substrate was bent by pressing a surface of the substrate on which the capacitor was not mounted by a pressing jig, and mechanical stress was applied to the substrate. This state was maintained for five seconds, and the amount of deflection was about 5 mm. After bending of the substrate, the multilayer ceramic capacitor sample was removed from the substrate. Then, the sample was polished in a direction perpendicular or substantially perpendicular to the substrate surface to provide a cross section, and the cross section was observed to find a crack in the ceramic base body. The percentage of samples cracked was calculated. The number of samples was 10.

(4) Measurement of Equivalent Series Resistance (ESR)

The equivalent series resistance (ESR) at a frequency of about 10 MHz was measured.

Regarding the above multilayer ceramic capacitors, the measurement results of the surface free energy of surface treatment agents, the measurement results of the porosity of the resin external electrode layers, the deflection test results, and the ESR measurement results are summarized in Table 1.

resin external electrode layers have a porosity of about 3.5% or more and about 5.3% or less, which is higher than a threshold of about 2%. After the deflection test, many ceramic base bodies crack, and furthermore, ESR is about 21 mΩ or more and about 30 mΩ or less.

Figure 6:
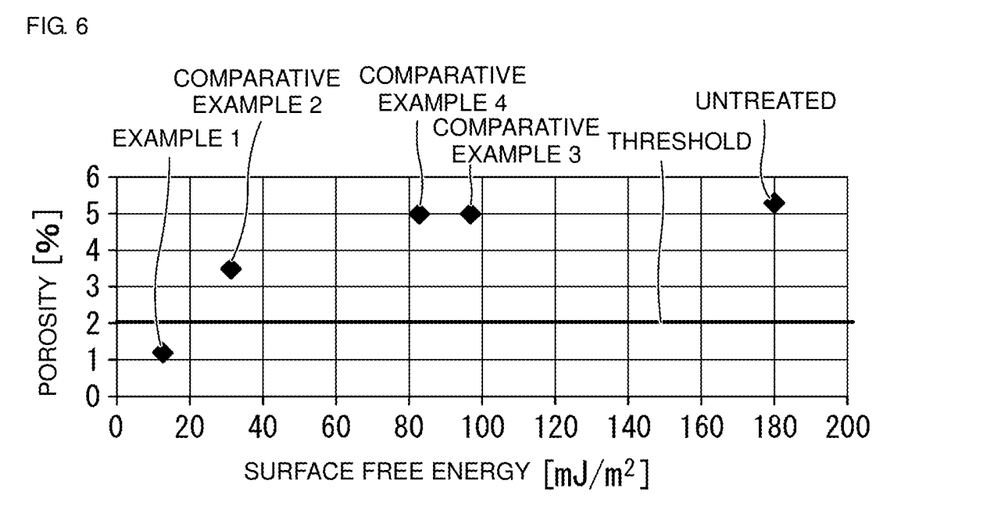
FIG. 6 is a graph of the relationship between the porosity of the resin external electrode layer and the surface free energy.

From Table 1, the relationship between the porosity of the resin external electrode layer and the surface free energy is graphed in FIG. 6. FIG. 6 shows a correlation between the porosity of the resin external electrode layer and the surface free energy of the surface treatment agent. It has been discovered that when the surface free energy is about 25 mJ/m$^2$ or less, the resin external electrode layer has a porosity of less than about 2%, the ceramic base body does not crack after the deflection test, and furthermore, ESR significantly improves.

The surface free energy may vary in the range of about 12.4 mJ/m$^2$ or more to about 25 mJ/m$^2$ or less according to the amount of alkyl-based silane coupling agent added.

Next, the multilayer ceramic capacitor samples in which the metal powder of the resin external electrode layer was a mixture of spherical metal powder and flat metal powder were produced. In such samples, each metal powder had a different sphere percentage. The porosity of the resin external electrode layers was calculated. In the multilayer ceramic capacitors in Examples 2 to 4, the surface of the metal powder was covered with an alkyl-based silane coupling agent defining and functioning as the surface treatment agent. In the multilayer ceramic capacitors in Comparative Examples 5 to 7, the surface of the metal powder was covered with a stearylamine (long-chain amine) agent defining and functioning as the surface treatment agent.

TABLE 1

| | Metal powder | Surface treatment agent | Surface free energy (mJ/m$^2$) | Porosity of resin external electrode layer [%] | Percentage of base body cracking observed from cross section after deflection test [%] | ESR (mΩ) |
|---|---|---|---|---|---|---|
| Comparative Example 1 | Ag-coated Cu | untreated | 180.3 | 5.30 | 90 | 28 |
| Comparative Example 2 | | stearic acid | 31.4 | 3.50 | 60 | 21 |
| Comparative Example 3 | | stearylamine (long-chain amine) | 96.7 | 5.01 | 90 | 30 |
| Comparative Example 4 | | stearic acid + stearylamine | 82.7 | 5.00 | 90 | 28 |
| Example 1 | | alkyl-based silane coupling | 12.4 | 1.19 | 0 | 17 |

As shown in Table 1, in Example 1, the surface of the metal powder is covered with the alkyl-based silane coupling agent, and thus, the resin external electrode layer has a porosity of about 1.19%, which is lower than a threshold of about 2%. After the deflection test, the ceramic base body does not crack, and furthermore, ESR is about 17 mΩ. Good results are obtained.

On the other hand, in Comparative Examples 1 to 4, the surface of the metal powder is untreated or covered with a stearic acid agent and/or a stearylamine agent, and thus, the The sphere percentage of the metal powder was calculated from the following formula:

sphere percentage={(weight of spherical metal powder)/(weight of spherical metal powder+weight of flat metal powder)}×100.

Regarding the above multilayer ceramic capacitors, the calculation results of the porosity of the resin external electrode layers are summarized in Table 2. Furthermore, from Table 2, the relationship between the porosity of the resin external electrode layer and the sphere percentage is graphed in FIG. 7.

TABLE 2

|  | Example 2 | Example 3 | Example 4 | Comparative Example 5 | Comparative Example 6 | Comparative Example 7 |
|---|---|---|---|---|---|---|
| Surface treatment agent | alkyl-based silane coupling | | | stearylamine (long-chain amine) | | |
| Sphere percentage [%] | 70 | 80 | 90 | 70 | 80 | 90 |
| Porosity [%] | 1.19 | 0.47 | 0.06 | 5.01 | 3.57 | 1.58 |
| Area of resin external electrode layer [cm$^2$] | 32.0 | 30.1 | 23.5 | 47.6 | 30.7 | 30.3 |
| Total area of pores [cm$^2$] | 0.38 | 0.14 | 0.01 | 2.39 | 1.09 | 0.48 |

Figure 7:
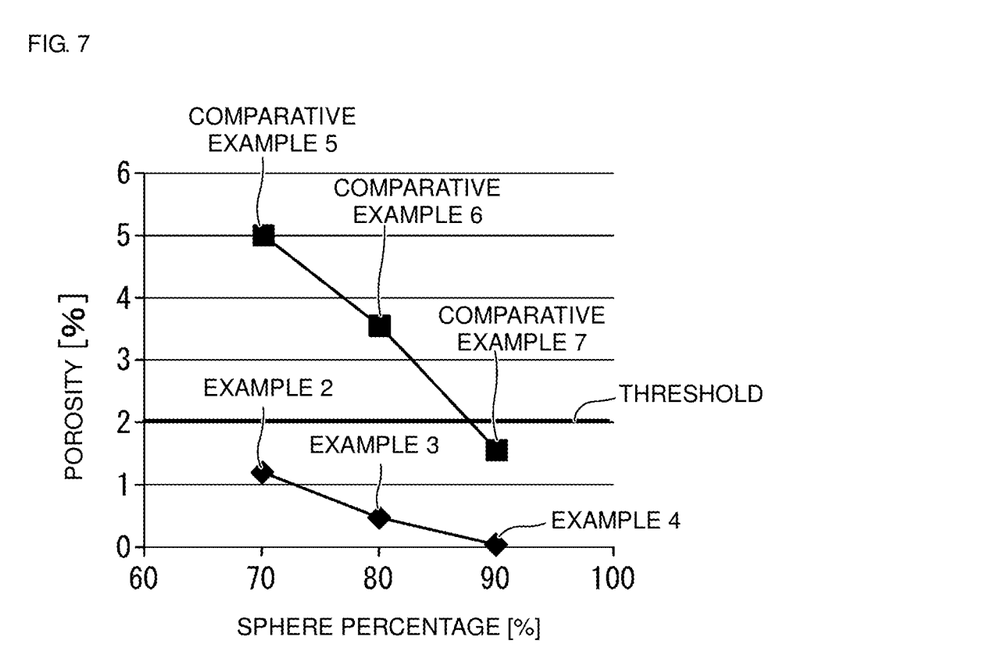
FIG. 7 is a graph of the relationship between the porosity of the resin external electrode layer and the sphere percentage.

From the results of Examples 2 to 4 in Table 2 and FIG. 7, it has been discovered that as the sphere percentage of the metal powder increases from about 70% to about 90%, the porosity of the resin external electrode layer decreases from about 1.19% to about 0.06%. In other words, it has been shown that when the alkyl-based silane coupling agent is included, the multilayer ceramic capacitor in which the porosity is less than about 2% is able to be provided at any of the above sphere percentages.

Preferred embodiments of the present invention are disclosed as described above. The present invention is not limited to such preferred embodiments.

In other words, the features of the above-described preferred embodiments, such as mechanisms, shapes, materials, numbers, positions, and arrangements, can be variously modified without departing from the technical idea and the scope of the present invention. Such modifications are included in the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A multilayer ceramic electronic component comprising:
a ceramic base body including a plurality of ceramic layers stacked on each other and a plurality of internal electrode layers stacked on each other, a first main surface and a second main surface that face each other in a stacking direction, a first side surface and a second side surface that face each other in a width direction perpendicular or substantially perpendicular to the stacking direction, and a first end surface and a second end surface that face each other in a length direction perpendicular or substantially perpendicular to the stacking direction and the width direction; and
a pair of external electrodes that are electrically connected to the internal electrode layers, each external electrode being provided on one of the first and second end surfaces, the first and second main surfaces, and the first and second side surfaces; wherein
each of the pair of external electrodes includes an underlying electrode layer electrically connected to the internal electrode layers and a resin external electrode layer stacked on the underlying electrode layer;
the resin external electrode layer includes a thermosetting resin, a metal powder, and an alkyl-based silane coupling agent that at least partially covers a surface of metal particles of the metal powder; and
an amount of carbon of the alkyl-based silane coupling agent relative to an amount of the metal powder is about 0.02 wt % or more and about 0.40 wt % or less in the resin external electrode layer.

2. The multilayer ceramic electronic component according to claim 1, wherein the thermosetting resin includes an epoxy resin.

3. The multilayer ceramic electronic component according to claim 1, further comprising a plating layer stacked on the resin external electrode layer.

4. The multilayer ceramic electronic component according to claim 3, wherein the plating layer includes a Ni plating.

5. The multilayer ceramic electronic component according to claim 1, wherein the metal powder includes at least one of Ag powder, Cu powder, and Ag-coated Cu powder.

6. The multilayer ceramic electronic component according to claim 1, wherein the multilayer ceramic electronic component is a multilayer ceramic capacitor.

7. The multilayer ceramic electronic component according to claim 1, wherein the resin electrode layer of each of the pair of external electrodes is provided on a portion of the underlying electrode layer that is provided on each of the first main surface, the second main surface, the first side surface, and the second side surface.

8. The multilayer ceramic electronic component according to claim 1, wherein the resin electrode layer of each of the pair of external electrodes has a thickness of about 10 μm or more and about 200 μm or less.

* * * * *